(12) United States Patent
Varkey et al.

(10) Patent No.: US 11,710,227 B2
(45) Date of Patent: Jul. 25, 2023

(54) DESIGN-TO-WAFER IMAGE CORRELATION BY COMBINING INFORMATION FROM MULTIPLE COLLECTION CHANNELS

(71) Applicant: KLA Corporation, Milpitas, CA (US)

(72) Inventors: Sunil Varkey, Kerala (IN); Dhiraj Ramesh Gawhane, Navi Mumbai (IN)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/338,648

(22) Filed: Jun. 3, 2021

(65) Prior Publication Data

US 2021/0398261 A1 Dec. 23, 2021

Related U.S. Application Data

(60) Provisional application No. 63/061,278, filed on Aug. 5, 2020.

(30) Foreign Application Priority Data

Jun. 19, 2020 (IN) .............................. 202041025897

(51) Int. Cl.
*G06T 5/50* (2006.01)
*G06T 7/00* (2017.01)
*G06T 7/32* (2017.01)
*H04N 23/56* (2023.01)

(52) U.S. Cl.
CPC ............... *G06T 7/001* (2013.01); *G06T 5/50* (2013.01); *G06T 7/32* (2017.01); *H04N 23/56* (2023.01); *G06T 2207/20221* (2013.01); *G06T 2207/30148* (2013.01)

(58) Field of Classification Search
CPC ........ G01R 31/311; G06T 2207/20221; G06T 2207/30148; H01L 22/12; H01L 21/0274; H01L 22/00; H01L 22/30; G02B 21/18; G02B 21/367; G02B 7/09; G02B 7/282; G03F 7/70616; G03F 7/70625
USPC ............................................................ 348/87
See application file for complete search history.

(56) References Cited

U.S. PATENT DOCUMENTS

| 10,859,923 B2 | 12/2020 | Sanguinetti et al. |
| 2013/0100446 A1* | 4/2013 | Yaashita ........... G01N 21/95607 356/365 |
| 2013/0129189 A1* | 5/2013 | Wu .......................... G06T 7/001 382/151 |
| 2017/0011495 A1* | 1/2017 | Gaind ................. G01N 21/9501 |
| 2019/0012778 A1* | 1/2019 | Shankar .................. G06T 7/001 |

(Continued)

FOREIGN PATENT DOCUMENTS

KR 101785039 B1 10/2017

OTHER PUBLICATIONS

WIPO, ISR for International Application No. PCT/US2021/036504, dated Sep. 27, 2021.

*Primary Examiner* — Masum Billah
(74) *Attorney, Agent, or Firm* — Hodgson Russ LLP

(57) ABSTRACT

At least three dark field images of a feature on a semiconductor wafer can be formed using an optical inspection system. Each of the at least three dark field images is from a different channel of the optical inspection system using an aperture that is fully open during image generation. The dark field images can be fused into a pseudo wafer image that is aligned with a corresponding design. This alignment can improve care area placement.

15 Claims, 5 Drawing Sheets

(56) References Cited

U.S. PATENT DOCUMENTS

2020/0022668 A1    1/2020   Maack
2020/0183290 A1*   6/2020   Sanguinetti .......... G01B 11/272

* cited by examiner

DESIGN-TO-WAFER IMAGE CORRELATION BY COMBINING INFORMATION FROM MULTIPLE COLLECTION CHANNELS

CROSS-REFERENCE TO RELATED APPLICATIONS

This application claims priority to Indian patent application filed Jun. 19, 2020 and assigned App. No. 202041025897 and the provisional patent application filed Aug. 5, 2020 and assigned U.S. App. No. 63/061,278, the disclosures of which are hereby incorporated by reference.

FIELD OF THE DISCLOSURE

This disclosure relates to semiconductor inspection.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

Wafer images may need to be aligned to a design file of the wafer for inspection and defect detection. Design alignment was performed using a wafer image from one collection channel. Only certain information can be collected using one channel. If design information is supposed to be aligned with a wafer image under these conditions, there is a possibility of inaccuracy during alignment of the wafer image and design file. This will result in incorrect placement of care areas in later inspection steps.

Therefore, new techniques for wafer inspection are needed.

BRIEF SUMMARY OF THE DISCLOSURE

A method is provided in a first embodiment. The method comprises generating at least three dark field images of a feature on a semiconductor wafer using an optical inspection system. Each of the at least three dark field images are from different channels of the optical inspection system. An aperture for each of the channels in the optical inspection system is fully open during the generating. The at least three dark field images are fused to form a pseudo wafer image using a processor. The pseudo wafer image is aligned with a corresponding design using the processor.

The different channels can include at least one side channel and at least one top channel.

The method can include importing care areas for inspection to the pseudo wafer image using the processor. Placement accuracy of the care areas also can be determined using the processor.

An optical system is provided in a second embodiment. The optical system comprises a stage configured to hold a semiconductor wafer; a light source that generates light directed to the stage; optics that receive light from the semiconductor wafer on the stage and provide three channels; three apertures that receive light from the semiconductor wafer on the stage; three detectors that receive light from the semiconductor wafer on the stage; and a processor in electronic communication with the three detectors. Each of the three detectors receives the light from a different one of the three channels. Each of the three apertures receives the light from a different one of the three channels. The processor is configured to: generate at least three dark field images of a feature on the semiconductor wafer; fuse the at least three dark field images to form a pseudo wafer image; and align the pseudo wafer image with a corresponding design. Each of the three dark field images is from a different one of the three channels.

The light source can include a laser.

The apertures can be fully open during the generating.

The three channels can include at least one side channel and at least one top channel.

The processor can be further configured to import care areas for inspection to the pseudo wafer image and to determine placement accuracy of the care areas.

A non-transitory computer-readable storage medium is provided in a third embodiment. The non-transitory computer-readable storage medium comprises one or more programs for executing the following steps on one or more computing devices. At least three dark field images are fused to form a pseudo wafer image. The at least three dark field images include a feature on a semiconductor wafer formed using an optical inspection system. Each of the at least three dark field images is from different channels of the optical inspection system. An aperture for each of the channels in the optical inspection system is fully open for the at least three dark field images. The pseudo wafer image is aligned with a corresponding design.

The different channels can include at least one side channel and at least one top channel.

The steps can further include determining placement accuracy using care areas.

The steps can further include importing care areas for inspection to the pseudo wafer image.

The steps can further include determining placement accuracy of the care areas.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Design files are used during wafer inspection. Design files can enable precise placement of care areas or design-based grouping (DBG) for the defects on a wafer. During this procedure, improved alignment between the design file with the inspection tool camera image can improve care area placement. In grey field and dark field systems (modes), this can be challenging due to the way image is captured. Sometimes, the challenge is due to the segmented collection architecture (i.e., more than one collection channels) which may only capture specific information in every given channel. An aperture setting for the collection channel also can affect design alignment. Embodiments disclosed herein demonstrate accurate design placement by increasing correlation.

Figure 1:
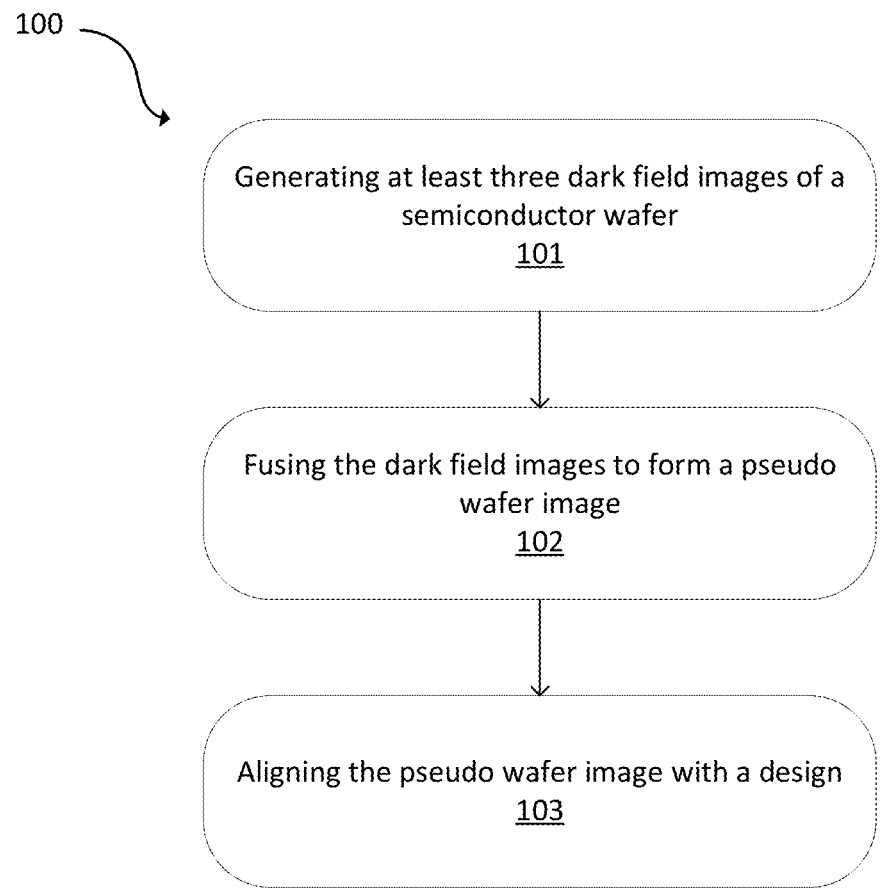
FIG. 1 is a flowchart of a method in accordance with the present disclosure.

As disclosed herein, information from multiple collection paths can be used to create a new pseudo wafer image for the design correlation. This improves accuracy. FIG. 1 shows a flowchart of the method 100. Some of all of the steps in the method 100 can use or involve a processor.

At 101, at least three dark field images of a feature on a semiconductor wafer are generated using an optical inspection system. Each of the at least three dark field images are from different channels of the optical inspection system. Dark field images exclude unscattered beams from the image and illuminate the wafer with light that is not part of the image, which means the field around the wafer is generally dark and the image appears as a dark background with bright objects. In an instance, the different channels can include at least one side channel and at least one top channel. For example, this can include two side channels and a top channel. At least one aperture in the optical inspection system (e.g., all the apertures) is fully open during the generating.

In an instance, there are two side channels and one top channel in an optical inspection system that uses laser inspection techniques. These can produce the three dark field images. Using the information from at least one side channel and the top channel can represent the overall image. Adding the information from the second side channel can improve the overall image quality.

Usually the aperture in the optical inspection system is partially blocked during inspection to filter off the repeating structures in the background. This usually helps detect defects. However, partially blocking the aperture can result in lost information when grabbing the wafer image for design alignment. Some or most of the information can be lost when the aperture is partially blocked. Thus, a fully open aperture provides more complete information from the wafer image using the embodiments disclosed herein.

At 102, the at least three dark field images are fused to form a pseudo wafer image. Fusion can be achieved by overlay stacking of wafer images from the multiple channels. In an embodiment using a laser scanning system, the fusion technique involves applying geometric mean of intensity values from different channels.

At 103, the pseudo wafer image is aligned with a corresponding design. Initially, a part of wafer is scanned and few target clips can be identified. These design clips can be overlayed with wafer image and is rendered to make it appear like the wafer image. An offset between the rendered image and the wafer image is determined based on user alignment of selected targets. The offset can be applied to all collected wafer images.

Care areas for inspection can be imported to the pseudo wafer image. Placement accuracy of the care areas can be determined using the processor. For example, placement accuracy can be verified by collecting job dumps (which simulate the actual wafer inspection on a small region) and confirming the care area placement on the wafer image. Optics settings can then be set to usual conditions for inspection. Improved wafer image to design correlation can be achieved using the method 100, which increases the accuracy of the care area placement.

Placement of care areas can be used with wafer inspection. Design-guided inspection also is used during wafer inspection. For either inspection technique, wafer image alignment with the design should be as accurate as possible. If the wafer image itself used for design correlation does not include all the information for alignment, then it may be difficult to confidently place care areas. The disclosed pseudo wafer image formed by merging the information from multiple collection paths and using the open aperture can prevent information from being lost. If the design is more accurately aligned with the wafer image, then care area placement also will be accurate.

Figure 2:
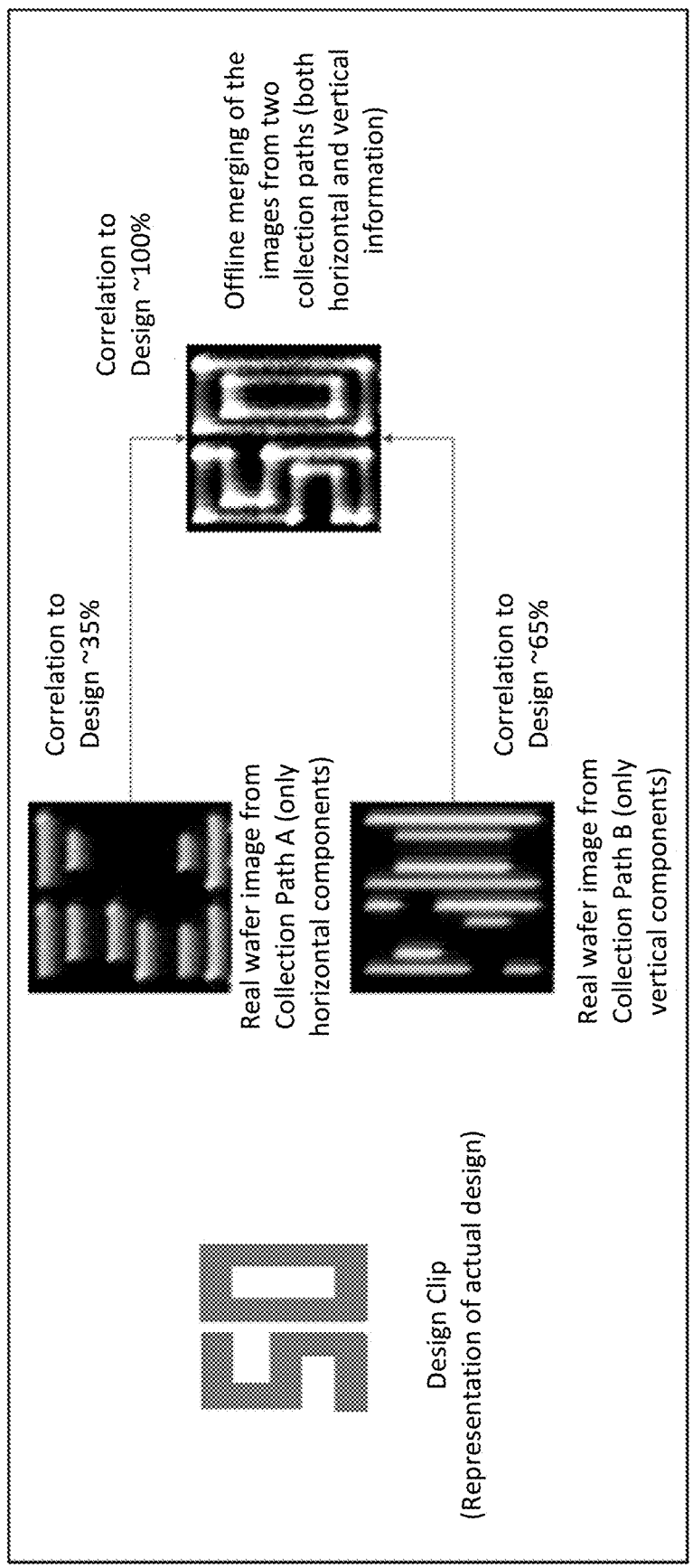
FIG. 2 is an example using the method of FIG. 1.
Figure 3:
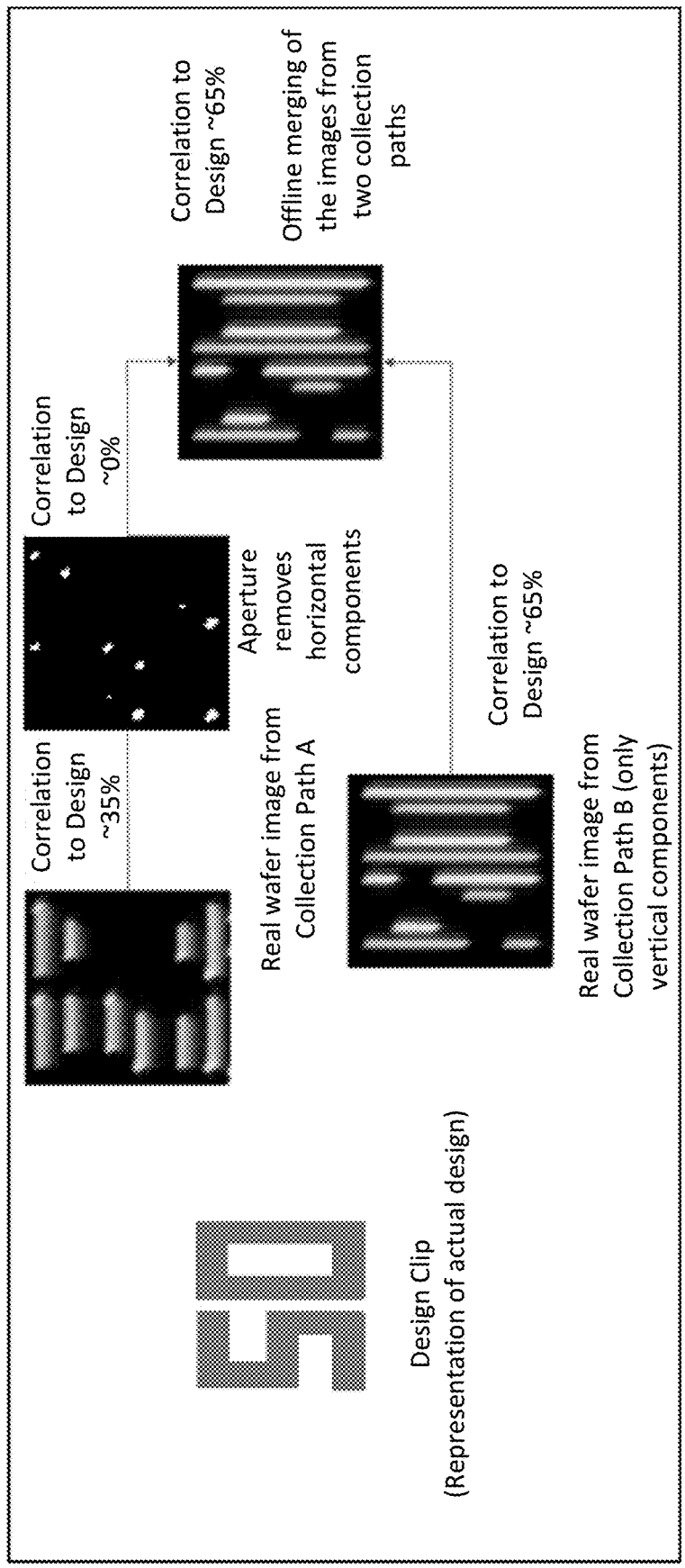
FIGS. 3 and 4 are examples that change some of the parameters of the method of FIG. 1.
Figure 4:
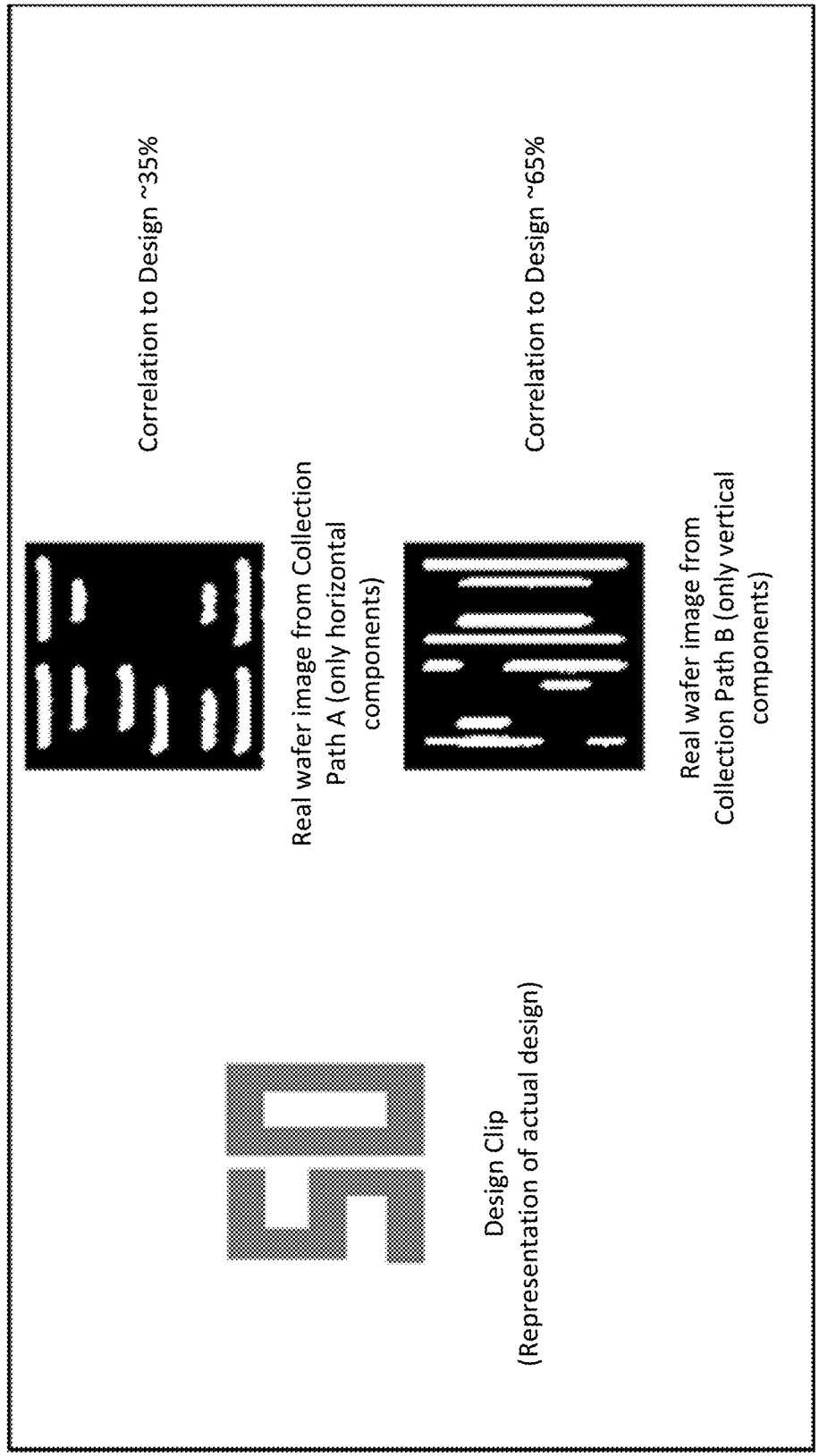

The effect of different aperture settings in the collection channel was investigated. FIG. 2 is an example using the method 100. FIGS. 3 and 4 are examples that change some of the parameters of the method 100. In FIG. 2, the design clip is illustrated on the left. The design clip represents the actual design of the semiconductor wafer. Two wafer images are illustrated in FIG. 2. The wafer images were generated with the aperture fully open. One is taken from Collection Path A, which primarily includes (or only includes) the horizontal components. The other is taken from Collection Path B, which primarily includes (or only includes) the vertical components. Alone, both the wafer images have poor correlation to the design clip. However, if the two wafer images are merged to form a pseudo wafer image that includes vertical and horizontal information, then the correlation of the pseudo wafer image is 100% with the design clip. FIG. 2 shows the correlation with fully open aperture setting, which demonstrates that using a fully open aperture setting and merging the image information from multiple collection paths can achieve higher wafer image to design correlation.

In an instance, an optical inspection system using laser techniques has two Collection Path A and one Collection Path B. This can provide an improved pseudo wafer image for many different wafer structures, which will result in improved inspection results.

In contrast, the aperture was not fully open in FIG. 3. Instead, a common aperture setting for general inspection was used. As seen in FIG. 3, the aperture setting eliminates the horizontal pattern information (Path A) for the inspection purpose. The inspection aperture condition may not provide an acceptable design correlation as compared FIG. 2. Furthermore, failure to fully open the aperture the background may not be clear in the resulting image, which may mean that repeating defects are missed during inspection.

As shown in FIG. 3, the general aperture setting that is not fully open removes wafer image information on Collection Path A. Removing this information is useful during defect detection stage because it enhances signal to noise ratio of defect. However during design alignment, complete wafer image information with a fully open aperture can ensure more accurate care area placement.

Use of only one collection channel is illustrated in FIG. 4. Using one of the collection channels at an aperture setting that is not fully open results in low correlation with a design when aligning design information with the wafer image.

Figure 5:
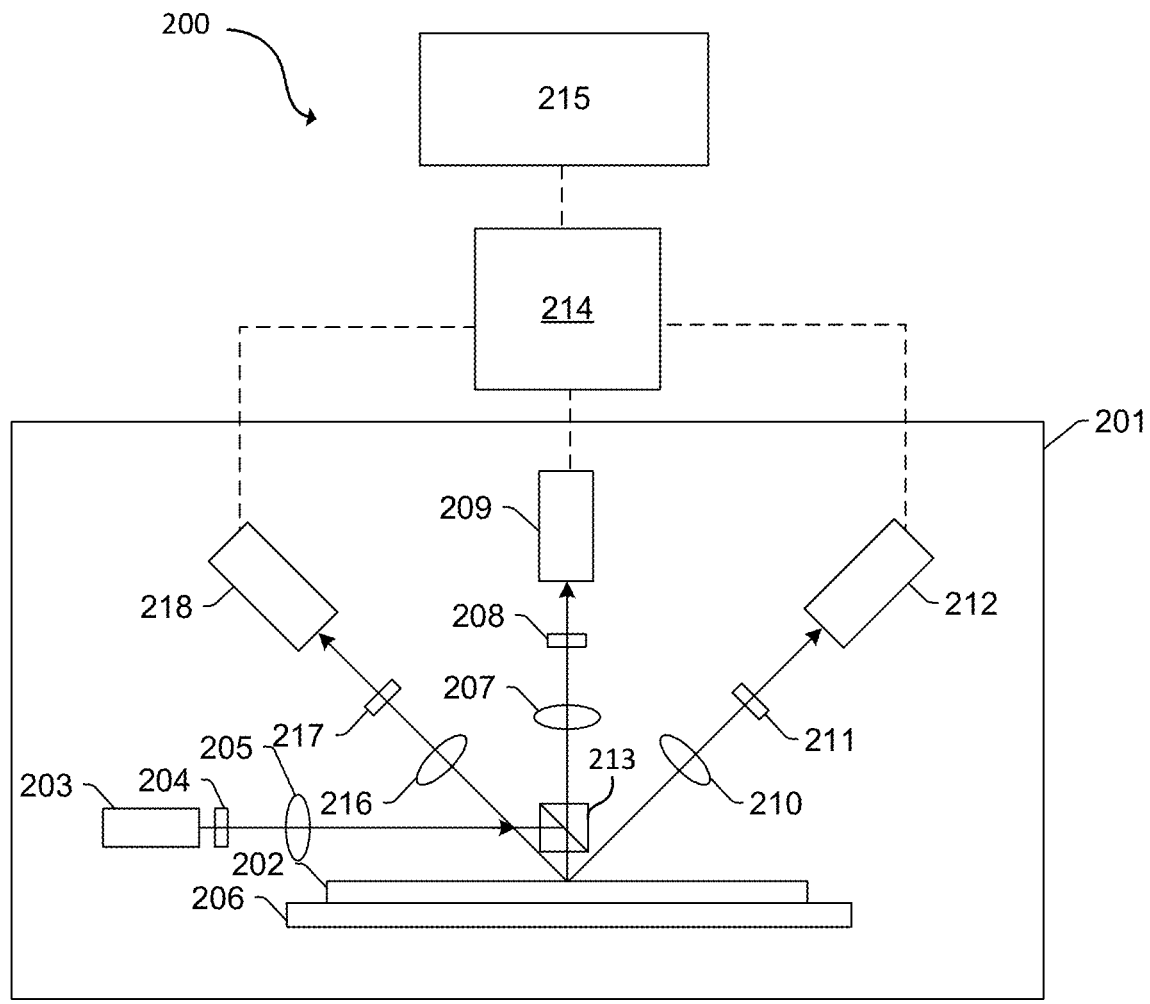
FIG. 5 is a diagram of an optical inspection system in accordance with the present disclosure.

One embodiment of a system 200 is shown in FIG. 5. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen 202 includes a reticle. The reticle may include any reticle known in the art.

In the embodiment of the system 200 shown in FIG. 5, optical based subsystem 201 includes an illumination subsystem configured to direct light to specimen 202. The illumination subsystem includes at least one light source. For example, as shown in FIG. 5, the illumination subsystem includes light source 203. In one embodiment, the illumination subsystem is configured to direct the light to the specimen 202 at one or more angles of incidence, which may include one or more oblique angles and/or one or more normal angles. In an instance, the system 200 has one normal angle of incidence. For example, as shown in FIG. 5, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 5. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time or at different times. For example, the illumination subsystem may include more than one illumination channel, one of the illumination channels may include light source 203, optical element 204, and lens 205 as shown in FIG. 5 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 5) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously. In another instance, the same wavelength of light is used for each channel.

In one embodiment, light source 203 may include a laser. However, the light source may include any other suitable light source such as a broadband plasma (BBP) source. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 5 as a single refractive optical element, it is to be understood that, in practice, lens 205 may include a number of refractive and/or reflective optical elements that in combination focus the light from the optical element to the specimen. The illumination subsystem shown in FIG. 5 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

Each channel can have its own aperture. The aperture is an example of the element 208, element 211, and element 218. The apertures in the system 200 can be fully open to obtain dark field images.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 5 includes three detection channels, one formed by collector 207, element 208, and detector 209, another formed by collector 210, element 211, and detector 212, and one formed by collector 216, element 217, and detector 218. As shown in FIG. 5, the three detection channels are configured to collect and detect light at different angles of collection. In some instances, one or more detection channels are configured to detect scattered light, and the detection channels are configured to detect tight that is scattered at different angles from the specimen 202. However, one or more of the detection channels may be configured to detect another type of light from the specimen 202 (e.g., reflected light).

In FIG. 5, the side channels with detector 212 and detector 218 can be examples of Collection Path A. The top channel using detector 209 can be an example of Collection Path B.

As further shown in FIG. 5, the detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 5 shows an embodiment of the optical based subsystem 201 that includes three detection channels, the optical based subsystem 201 may include a different number of detection channels (e.g., one detection channel, two detection channels, or more than three detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 5 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 5 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 5 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with a scanning electron microscope.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be further configured as described herein.

The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to generate at least three dark field images of a feature on the semiconductor wafer, fuse the at least three dark field images to form a pseudo wafer image, and align the pseudo wafer image with a corresponding design. The processor 214 can be further configured to import care areas for inspection to the pseudo wafer image and to determine placement accuracy of the care areas.

An additional embodiment relates to a non-transitory computer-readable medium storing program instructions executable on a controller for performing a computer-implemented method for generating a pseudo image and aligning the pseudo image to the design, as disclosed herein. In particular, as shown in FIG. 5, electronic data storage unit 215 or other storage medium may contain non-transitory computer-readable medium that includes program instructions executable on the processor 214. The computer-implemented method may include any step(s) of any method(s) described herein, including method 100. In particular, the steps can include fusing at least three dark field images to form a pseudo wafer image and aligning the pseudo wafer image with a corresponding design. The at least three dark field images can include a feature on a semiconductor wafer using an optical inspection system.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
    generating at least three dark field images of a feature on a semiconductor wafer using an optical inspection system, wherein each of the at least three dark field images are from different channels of the optical inspection system, and wherein an aperture for each of the channels in the optical inspection system is fully open during the generating;
    fusing the at least three dark field images to form a pseudo wafer image using a processor, wherein the fusing includes overlay stacking of the at least three dark field images; and
    aligning the pseudo wafer image with a corresponding design in a design file using the processor, wherein the aligning includes overlaying the design with the pseudo wafer image.

2. The method of claim 1, wherein the different channels include at least one side channel and at least one top channel.

3. The method of claim 1, further comprising importing care areas for inspection to the pseudo wafer image using the processor.

4. The method of claim 3, further comprising determining placement accuracy of the care areas using the processor.

5. An optical inspection system comprising:
    a stage configured to hold a semiconductor wafer;
    a light source that generates light directed to the stage;
    optics that receive light from the semiconductor wafer on the stage and provide three channels;
    three apertures that receive light from the semiconductor wafer on the stage, wherein each of the three apertures receives the light from a different one of the three channels;
    three detectors that receive light from the semiconductor wafer on the stage, wherein each of the three detectors receives the light from a different one of the three channels; and
    a processor in electronic communication with the three detectors, wherein the processor is configured to:
        generate at least three dark field images of a feature on the semiconductor wafer, wherein each of the three dark field images is from a different one of the three channels;
        fuse the at least three dark field images to form a pseudo wafer image, wherein the fusing includes overlay stacking of the at least three dark field images; and
        align the pseudo wafer image with a corresponding design in a design file, wherein the aligning includes overlaying the design with the pseudo wafer image.

6. The optical inspection system of claim 5, wherein the light source includes a laser.

7. The optical inspection system of claim 5, wherein the apertures are fully open during the generating.

8. The optical inspection system of claim 5, wherein the three channels include at least one side channel and at least one top channel.

9. The optical inspection system of claim 5, wherein the processor is further configured to import care areas for inspection to the pseudo wafer image.

10. The optical inspection system of claim 9, wherein the processor is further configured to determine placement accuracy of the care areas.

11. A non-transitory computer-readable storage medium, comprising one or more programs for executing the following steps on one or more computing devices:
    fusing at least three dark field images to form a pseudo wafer image, wherein the at least three dark field images include a feature on a semiconductor wafer formed using an optical inspection system, wherein each of the at least three dark field images are from different channels of the optical inspection system, wherein the fusing includes overlay stacking of the at least three dark field images, and wherein an aperture for each of the channels in the optical inspection system is fully open for the at least three dark field images; and
    aligning the pseudo wafer image with a corresponding design in a design file, wherein the aligning includes overlaying the design with the pseudo wafer image.

12. The non-transitory computer-readable storage medium of claim 11, wherein the different channels include at least one side channel and at least one top channel.

13. The non-transitory computer-readable storage medium of claim 11, wherein the steps further include determining placement accuracy using care areas.

14. The non-transitory computer-readable storage medium of claim 11, wherein the steps further include importing care areas for inspection to the pseudo wafer image.

15. The non-transitory computer-readable storage medium of claim 11, wherein the steps further include determining placement accuracy of the care areas.

* * * * *